United States Patent [19]
Nakai

[11] Patent Number: 5,694,365
[45] Date of Patent: Dec. 2, 1997

[54] SEMICONDUCTOR MEMORY DEVICE CAPABLE OF SETTING THE MAGNITUDE OF SUBSTRATE VOLTAGE IN ACCORDANCE WITH THE MODE

[75] Inventor: Jun Nakai, Hyogo, Japan

[73] Assignee: Mitsubishi Denki Kabushiki Kaisha, Tokyo, Japan

[21] Appl. No.: 779,185

[22] Filed: Jan. 6, 1997

[30] Foreign Application Priority Data

Feb. 15, 1996 [JP] Japan ..................... 8-027636

[51] Int. Cl.$^6$ ..................................................... G11C 7/00
[52] U.S. Cl. ................... 365/203; 365/189.11; 365/226; 365/227
[58] Field of Search .................... 365/189.11, 203, 365/226, 227

[56] References Cited

U.S. PATENT DOCUMENTS

| | | | |
|---|---|---|---|
| 4,401,897 | 8/1983 | Martino, Jr. et al. | 307/297 |
| 4,985,869 | 1/1991 | Miyamoto | 365/226 |
| 5,329,168 | 7/1994 | Sugibayashi et al. | 365/226 |
| 5,341,340 | 8/1994 | Hagura | 365/226 |
| 5,376,840 | 12/1994 | Nakayama | 365/226 |

FOREIGN PATENT DOCUMENTS

| | | |
|---|---|---|
| 59-162690 | 9/1984 | Japan . |
| 1-213892 | 8/1989 | Japan . |
| 2-312095 | 12/1990 | Japan . |
| 4-114393 | 4/1992 | Japan . |
| 2 300 282 | 10/1996 | United Kingdom ............ G05F 3/20 |

*Primary Examiner*—David C. Nelms
*Assistant Examiner*—F. Niranjan
*Attorney, Agent, or Firm*—Lowe, Price, LeBlanc & Becker

[57] ABSTRACT

A DRAM includes a substrate voltage generation unit for generating a substrate voltage having a negative value to be applied to a first node. The substrate voltage generation unit includes a detecting circuit. The detecting circuit includes a first PMOS transistor provided in series between a second node with a ground potential and a third node and a second PMOS transistor, and further includes a third PMOS transistor provided in parallel to the first PMOS transistor. The first and second PMOS transistors have the gates connected to the third node, and the third PMOS transistor has a gate receiving a signal. The detecting circuit is provided between the second node with the ground voltage and the first node, and further includes an NMOS transistor having a gate connected to the third node. The third PMOS transistor receives the signal of the "L" level in the self refresh mode and the signal of the "H" level in the normal mode. As a result, the clamp level of the substrate voltage is greater in the self refresh mode than in the normal mode. More specially, the NMOS transistor is turned on with the greater substrate voltage in the self refresh mode than the normal mode, so that the substrate voltage is increased and the capability of pause refresh is improved. Consequently, the interval of internal /RAS can be increased and power consumption can be reduced in the self refresh mode.

14 Claims, 10 Drawing Sheets

5,694,365

1

SEMICONDUCTOR MEMORY DEVICE CAPABLE OF SETTING THE MAGNITUDE OF SUBSTRATE VOLTAGE IN ACCORDANCE WITH THE MODE

BACKGROUND OF THE INVENTION

1. Field of the Invention

The present invention relates to semiconductor memory devices having a substrate voltage generation circuit (backbias voltage generation circuit), and more particularly, to a semiconductor memory device having a substrate voltage generation unit, which allows setting of a substrate voltage in the self refresh mode greater than that in the normal mode, and realizing reduction in power consumption.

2. Description of the Background Art

In general, a Dynamic Random Access Memory (hereinafter referred to as a "DRAM") as a semiconductor memory device has self refresh mode. After the usual memory cycles are completed, a row address strobe signal /RAS and a column address strobe signal /CAS take the CBR (/CAS before /RAS) timing and a pulse width $t_{RAS}$ of signal /RAS or a pulse width $t_{CAS}$ of signal /CAS is set greater than 70 μs. If the pulse Width exceeds this time period, internally refresh operation is initiated and self refresh continues as long as both signals /RAS and /CAS are at the "L" (low) level. Such condition is called self refresh mode. In such self refresh mode, an internal counter successively counts up row addresses and all the memory cells included in the memory cell array are refreshed.

In such a case, when internal /RAS attains the "L" level, signal readout, amplification, and rewriting are carried out for all the memory cells on the corresponding word line in accordance with the row address from the internal counter.

Refresh operation is carried out because of the following reason. Storage information is held in a memory cell by accumulating electric charges in a capacitor. However, since there is a leakage current, the sufficient amount of electric charges applied at first to the capacitor is reduced by the leakage current, thereby destroying storage information.

Thus, when data of "H" level (positive charges) disappears from the memory cell, the period from the time when the "H" level data is written (positive charges are accumulated) to the time when the memory cell cannot be determined as holding the "H" level data is generally called capability of pause refresh. Therefore, the "H" level data does not change to the "L" level data even without refresh if it is within the range of the capability of pause refresh.

Thus, the period of self refresh mode must fall within the capability of pause refresh. Therefore, the interval of internal /RAS attaining the "L" level is determined by the capability of pause refresh.

As described above, the current consumed per unit time is determined by the interval of internal /RAS attaining the "L" level in the self refresh mode. More specifically, the greater number of times internal /RAS attains the "L" level per unit time, the more current (electric power) is consumed per unit time. In other words, the consumed current (consumed electric power) for a given time is decreased by extending or improving the capability of pause refresh to reduce the number of times internal /RAS attains the "L" level for a given time.

The capability of pause refresh can be improved by increasing a substrate voltage of a negative value applied to a P type semiconductor substrate. Therefore, in order to

2 improve the capability of pause refresh to reduce the current consumed per unit time in the self-refresh mode, the substrate voltage in the self refresh mode must be greater than that in the normal mode.

SUMMARY OF THE INVENTION

An object of the present invention is to provide a semiconductor memory device that has a substrate voltage generation unit for generating a substrate voltage in the self refresh mode greater than that in the normal mode and is capable of achieving reduction in power consumption.

The semiconductor memory device according to the present invention has a normal mode and a special mode. The semiconductor memory device according to the present invention includes a substrate voltage generation unit for generating a substrate voltage of a negative value to be applied to an output node.

The substrate voltage generation unit includes a detecting circuit and a voltage generation circuit. The detecting circuit detects the potential level of the output node. The voltage generation circuit generates a substrate voltage.

The detecting circuit discharges electrons from the output node when the potential of the output node is smaller than a prescribed potential. The detecting means is responsive to a signal indicating that the special mode is entered to set the prescribed potential greater than that in the normal mode.

As described above, in the semiconductor memory device according to the present invention, the predetermined potential used as a reference for detecting the potential level of the output node is set greater in the special mode than in the normal mode. Therefore, the substrate voltage in the special mode exceeds the substrate voltage in the normal mode.

As a result, in the semiconductor memory device according to the present invention, the capability of pause refresh can be improved in the special mode, thereby providing the following effects. When operation is required for a predetermined number of times within the range of the capability of pause refresh, the number of times the operation is performed is reduced for a given time period with the higher capability of pause refresh, so that power consumption for the given time period can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Now, a DRAM as a semiconductor memory device according to the present invention will be described below with reference to the drawings.

[First Embodiment]

Figure 1:
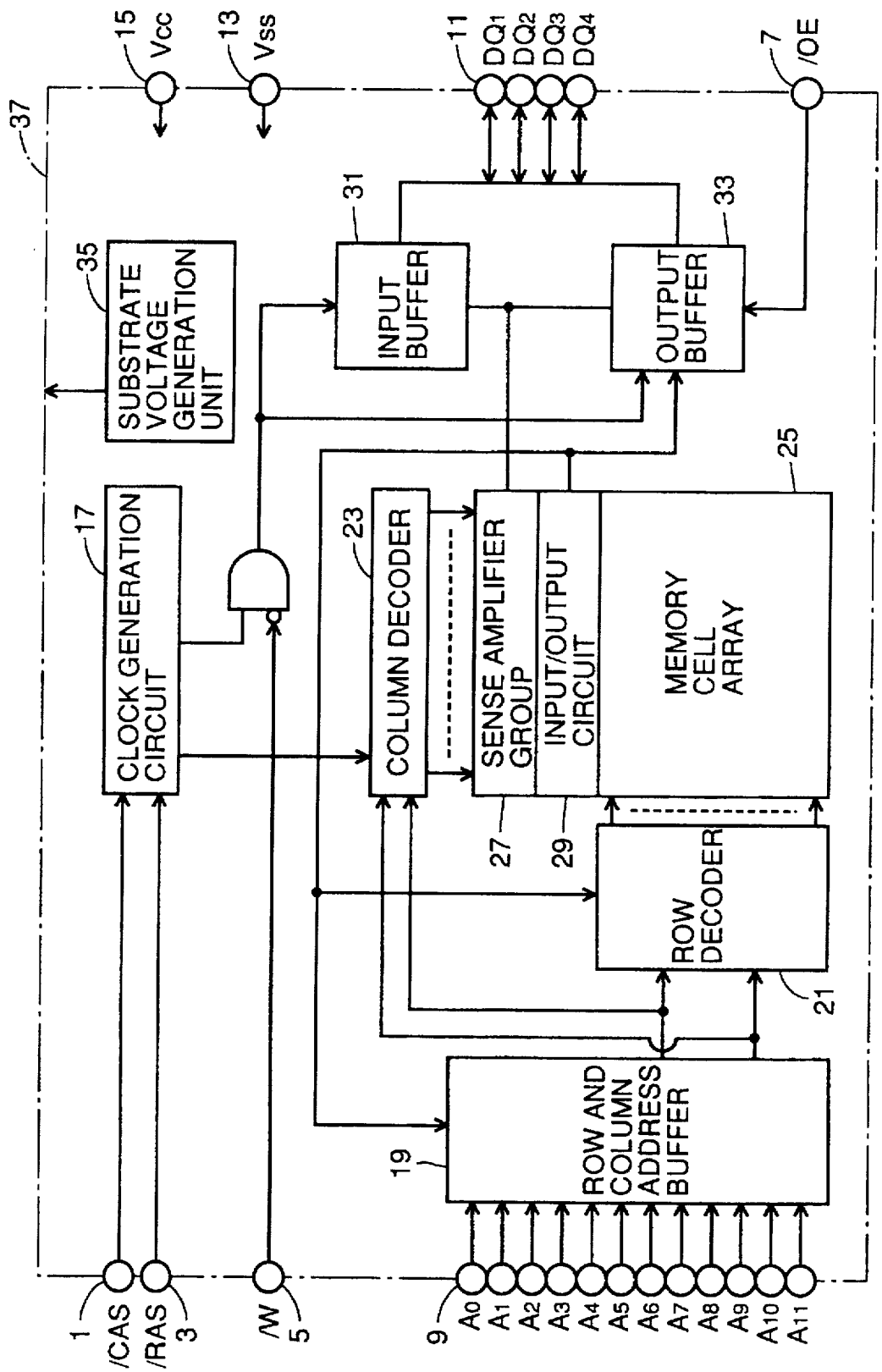
FIG. 1 is a schematic block diagram showing the entire structure of a DRAM according to the first embodiment of the present invention.

FIG. 1 is a schematic block diagram showing a DRAM as a semiconductor memory device according to the first embodiment of the present invention.

Referring to FIG. 1, the DRAM according to the first embodiment includes control signal input terminals 1–7, an address signal input terminal group 9, a data signal input/output terminal group 11, a ground terminal 13 and a power supply terminal 15. The DRAM further includes a clock generation circuit 17, a row and column address buffer 19, a row decoder 21, a column decoder 23, a memory cell array 25, a sense amplifier group 27, an input/output circuit 29, an input buffer 31, an output buffer 33, and a substrate voltage generation unit 35.

Based on column address strobe signal /CAS and row address strobe signal /RAS externally applied through control signal input terminals 1 and 3, clock generation circuit 17 selects a predetermined operation mode to control the entire DRAM.

Upon read out and writing operation, row and column address buffer 19 selectively applies, to row decoder 21 and column decoder 23, address signals A0–A11 externally applied through address signal input terminal group 9.

In memory cell array 25, a plurality of word lines (not shown) are arranged in a row direction and a plurality of bit line pairs (now shown) are arranged in a column direction, and a plurality of memory cells (not shown) are arranged at their intersections.

Row decoder 21 is responsive to a row address signal supplied from row and column address buffer 19, and selects and drives one of the plurality of word lines. Column decoder 23 is responsive to a column address signal supplied from row and column address buffer 19 and selects one of the plurality of bit line pairs.

Sense amplifier group 27 includes a plurality of sense amplifiers. The plurality of sense amplifiers are provided corresponding to the plurality of bit line pairs. Each sense amplifier amplifies the potential difference between the corresponding bit lines.

Input/output circuit 29 supplies to output buffer 33 the potential of the bit line pair selected by column decoder 23. Output buffer 33 is responsive to an output enable signal /OE applied from control signal input terminal 7 and amplifies the supplied potential to externally apply as output data DQ1–DQ4.

In response to a write enable signal /W applied from control signal input terminal 5, input buffer 31 amplifies the externally applied input data DQ1–DQ4. Input/output circuit 29 provides the input data amplified at input buffer 31 to the bit line pair selected by column decoder 23.

Substrate voltage generation unit 35 applies a substrate voltage having a negative value (backbias voltage) to a P type semiconductor substrate 37. The DRAM according to the present invention is characterized by this substrate voltage generation unit 35. Therefore, description will be made hereinafter focusing on substrate voltage generation unit 35.

Figure 2:
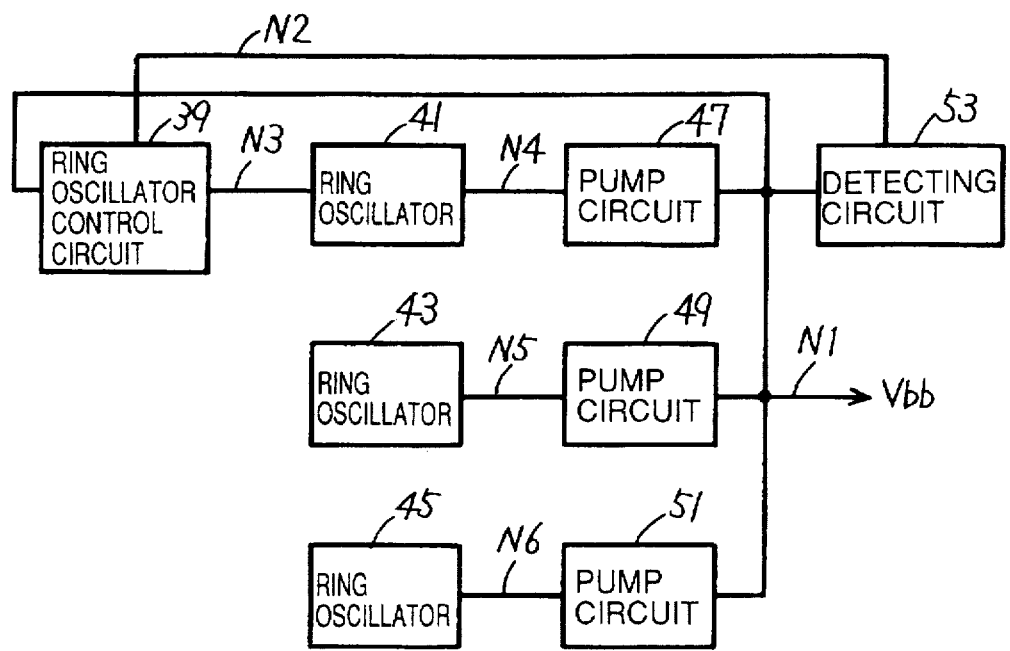
FIG. 2 is a schematic block diagram showing in detail a substrate voltage generation unit shown in FIG. 1.

FIG. 2 is a schematic block diagram showing in detail substrate voltage generation unit 35 shown in FIG. 1.

Referring to FIG. 2, the substrate voltage generation unit includes a ring oscillator control circuit 39, ring oscillators 41–45, pump circuits 47–51, and a detecting circuit 53.

A first substrate voltage generation circuit formed by ring oscillator 41 and pump circuit 47 generates a first substrate voltage to be applied to an output node N1. A second substrate voltage generation circuit formed by ring oscillator 43 and pump circuit 49 generates a second substrate voltage to be applied to output node N1. A third substrate voltage generation circuit formed by ring oscillator 45 and pump circuit 51 generates a third substrate voltage to be applied to output node N1.

Therefore, a substrate voltage Vbb generated by the substrate voltage generation unit is determined by the three substrate voltages generated from the three pump circuits 47, 49 and 51. For convenience, the first substrate voltage generated from pump circuit 47, the second substrate voltage generated from pump circuit 49, and the third substrate voltage generated from pump circuit 51 are all referred to as substrate voltage Vbb.

Pump circuit 47 including a capacitor with a large capacitance generates substrate voltage Vbb based on a pulse signal from ring oscillator 41. It should be noted that, when detecting circuit 53 determines that the potential of output node N1 exceeds a first predetermined potential (hereinafter referred to as the "sustainment level"), ring oscillator control circuit 39 and ring oscillator 41 perform operation. In other words, the sustainment level is provided to prevent substrate voltage Vbb having a negative value from increasing beyond this level.

Meanwhile, when detecting circuit 53 determines that the potential of output node N1 is lower than a second predetermined potential (hereinafter referred to as the "clamp level"), the electrons at output node N1 are discharged to a node with the ground potential. In other words, the clamp level is provided to prevent substrate voltage Vbb of a negative value from decreasing excessively. Ring oscillator 41 generates a pulse signal with a short period.

Pump circuit 49 having a capacitor with a small capacitance operates in accordance with a pulse signal from ring oscillator 43, which generates a pulse signal with a long period. Ring oscillator 43 is constantly in operation.

Pump circuit 51 including a capacitor with a capacitance greater than that of the capacitor in pump circuit 47 operates in accordance with a pulse signal from ring oscillator 45.

Ring oscillator 45 generates a pulse upon transition of a signal ZRASE from the "H" level to the "L" level or from the "L" level to the "H" level. Signal ZRASE attains the "L" level in response to signal /RAS attaining the "L" level, and attains the "H" level in response to signal /RAS attaining the "H" level.

Now, description will be made of the internal voltage generation unit in the standby state of the DRAM.

Upon power-on, pump circuits 47 and 49 operate to generate substrate voltage Vbb to the sustainment level. As described above, although pump circuit 47 stops operation when substrate voltage Vbb reaches the sustainment level, pump circuit 49 is constantly operative.

Now, description will be made of the internal voltage generation unit in the active state of the DRAM.

When signal /RAS attains the "L" level, i.e. when signal ZRASE attains the "L" level, ring oscillator 45 generates a pulse, thereby causing operation of pump circuit 51. Thus, substrate voltage Vbb consumed in the active state is replenished. Pump circuit 47 operates in accordance with the sustainment level. Pump circuit 49 is always operative.

Figure 3:
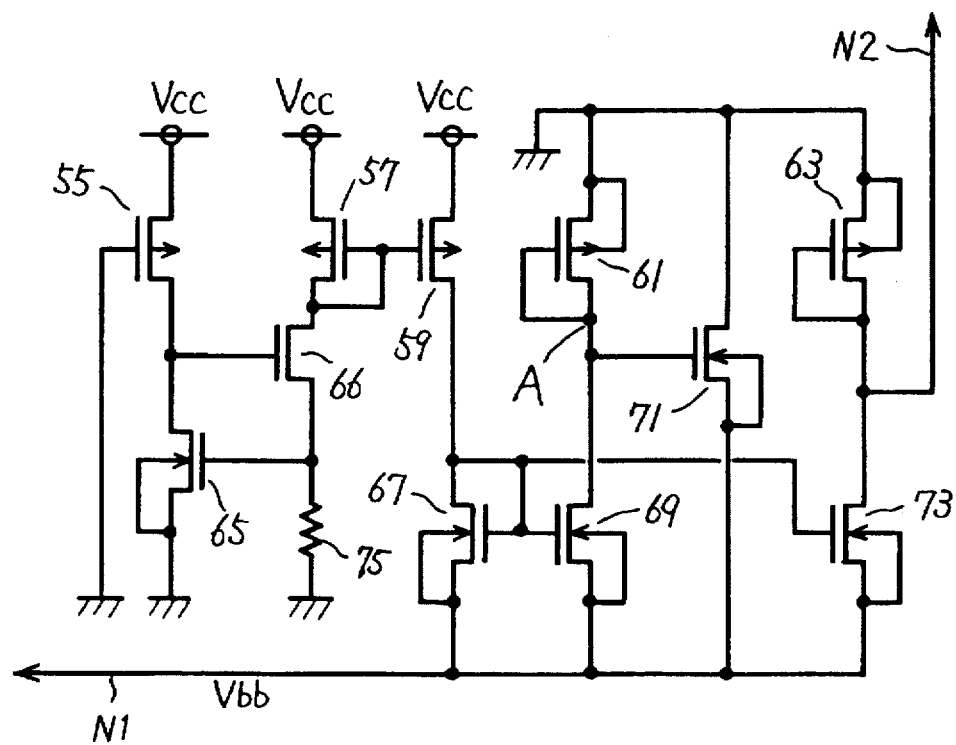
FIG. 3 is a circuit diagram showing in detail a general detecting circuit shown in FIG. 2.

FIG. 3 is a circuit diagram showing in detail a general detecting circuit 53 shown in FIG. 2. The portions similar to those in FIG. 2 are labeled with the identical reference numerals and description thereof will not be repeated.

Referring to FIG. 3, a PMOS transistor 61 determines the clamp level, while a PMOS transistor 63 determines the sustainment level. It is to be noted that the resistance of PMOS transistor 63 is set smaller than that of PMOS transistor 61 because the sustainment level must exceed the clamp level.

Description will now be made of the clamp level. It is now assumed that the potential of a node A is denoted as A and the threshold voltage of an NMOS transistor 71 as Vth. The voltage of node N1 is substrate voltage Vbb. As a result, the condition for turning on NMOS transistor 71 is as follows:

$$A-Vth>Vbb \qquad (1)$$

Consequently, smaller resistance of PMOS transistor 61 leads to the greater clamp level and NMOS transistor 71 turns on when substrate potential Vbb is great in value. NMOS transistor 71 thus turned on discharges electrons to the node with the ground potential. When the resistance of PMOS transistor 61 is increased, the clamp level is decreased and NMOS transistor 71 turns on with the smaller substrate voltage.

Description will now be made of the sustainment level. When the resistance of PMOS transistor 63 is decreased, the sustainment level is increased and PMOS transistor 63 is turned on with the great substrate voltage Vbb. In accordance therewith, ring oscillator control circuit 39 shown in FIG. 2 causes ring oscillator 41 to stop operation. When the resistance of PMOS transistor 63 is increased, the sustainment level is decreased and PMOS transistor 63 is turned on with the smaller substrate voltage Vbb.

Figure 4:
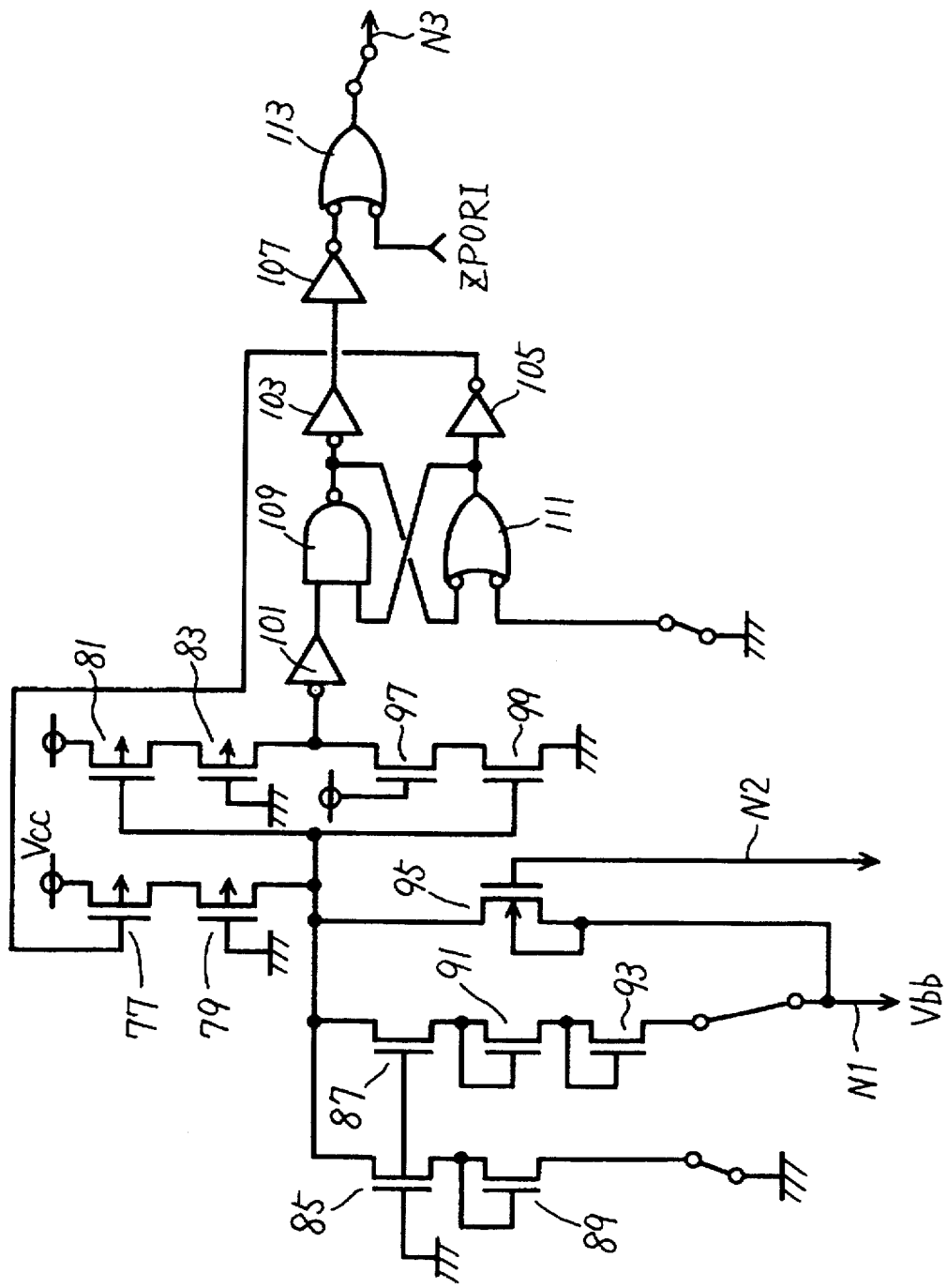
FIG. 4 is a circuit diagram showing in detail a general ring oscillator control circuit shown in FIG. 2.

FIG. 4 is a circuit diagram showing in detail the general ring oscillator control circuit 39 shown in FIG. 2. The portions similar to those in FIG. 2 are indicated by the same reference numerals and description thereof will not be repeated.

Referring to FIG. 4, ring oscillator control circuit 39 includes PMOS transistors 77–83, NMOS transistors 85–99, inverters 101–107, an NAND circuit 109, and NAND circuits (negative logic) 111 and 113.

When substrate voltage Vbb falls short of the sustainment level, the ring oscillator control circuit is responsive to turn-on of PMOS transistor 63 shown in FIG. 3 and applies a signal of the "H" level to node N3 and stops operation of ring oscillator 41 shown in FIG. 2. When substrate voltage Vbb exceeds the sustainment level, PMOS transistor 63 of FIG. 3 is turned off, and, in response to this turn-off of PMOS transistor 63, the ring oscillator control circuit applies a signal of the "L" level to node N3 and causes ring oscillator 41 of FIG. 2 to operate.

It should be noted that signal ZPORI applied to NAND circuit (negative logic) 113 is a signal controlling so that the ring oscillator control circuit attains an operative state after a predetermined time period has elapsed from the power-on. More specifically, when signal ZPORI attains the "L" level after a prescribed time period has elapsed, the ring oscillator control circuit outputs the signal of the "L" level to node N3 and triggers operation of ring oscillator 41 shown in FIG. 2 in accordance with the sustainment level of detecting circuit 53 shown in FIG. 2.

Figure 5:
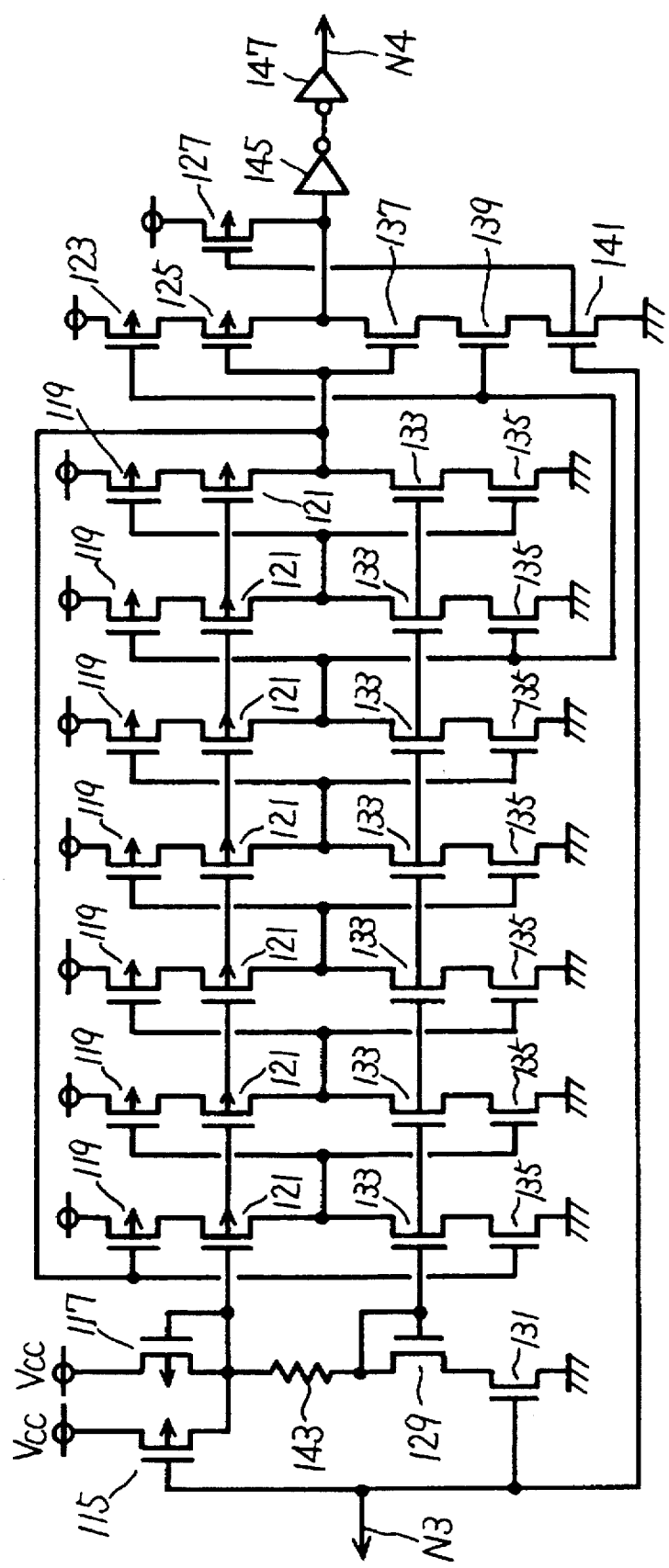
FIG. 5 is a circuit diagram showing in detail a general ring oscillator connected to node N4 shown in FIG. 2.

FIG. 5 is a circuit diagram showing in detail the general ring oscillator 41 shown in FIG. 2. The portions similar to those in FIG. 2 are indicated by the same reference numerals and description thereof will not be repeated.

Referring to FIG. 5, ring oscillator 41 of FIG. 2 includes PMOS transistors 115–127, NMOS transistors 129–141, a resistor 143, and inverters 145 and 147. PMOS transistors 119 and 121 and NMOS transistors 133 and 135 form an inverter. PMOS transistors 121 and NMOS transistor 133 forming this inverter are provided to eliminate the through current.

The circuit formed by PMOS transistors 115 and 117, resistor 143, and NMOS transistors 129 and 131 is a circuit for controlling PMOS transistor 121 and NMOS transistor 133. The ring oscillator shown in FIG. 5 operates when a signal of the "L" level is received at node N3 and applies a pulse signal with a short period to node N4.

Figure 6:
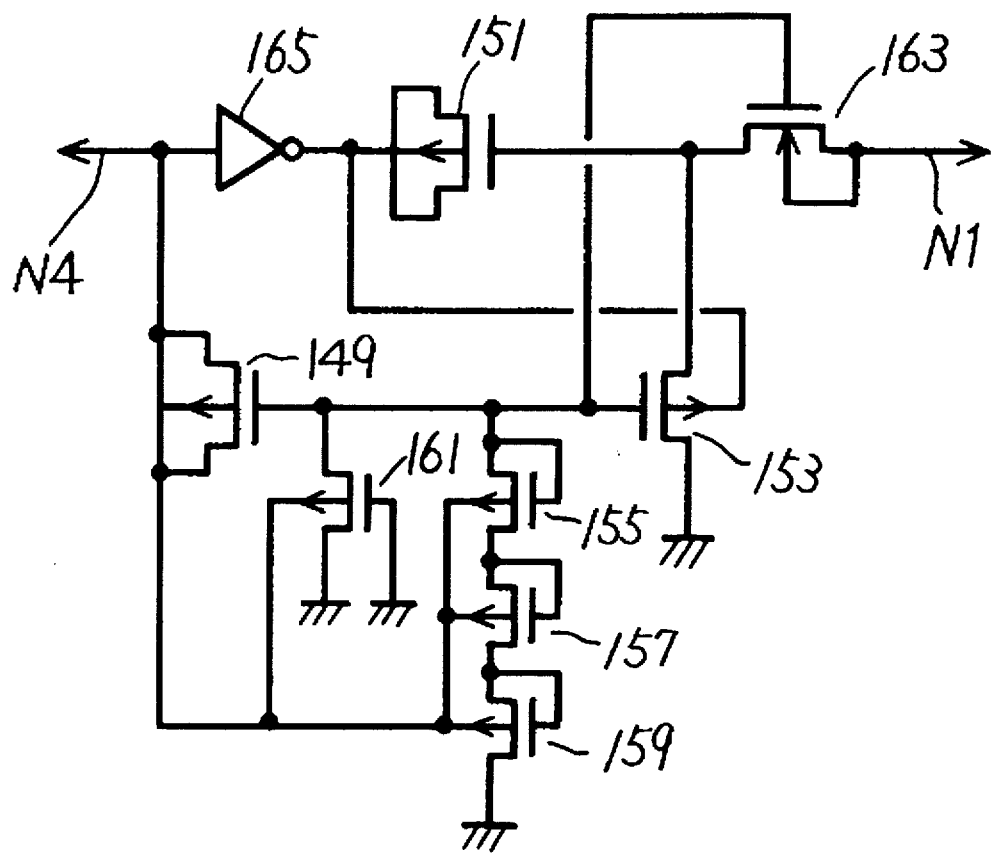
FIG. 6 is a circuit diagram showing in detail a pump circuit shown in FIG. 2.

FIG. 6 is a circuit diagram showing in detail the general pump circuit 47 shown in FIG. 2. The portions similar to those in FIG. 2 are indicated by the same reference numerals and description thereof will not be repeated.

Referring to FIG. 6, the general pump circuit 47 of FIG. 2 includes PMOS transistors 149–161, an NMOS transistor 163, and an inverter 165. The general pump circuit shown in FIG. 6 generates substrate voltage Vbb to be applied to node N1 in response to the pulse signal applied to node N4 from ring oscillator 41 shown in FIG. 2. The general pump circuits 49 and 51 of FIG. 2 are similar in structure to the general pump circuit shown in FIG. 6.

Figure 7:
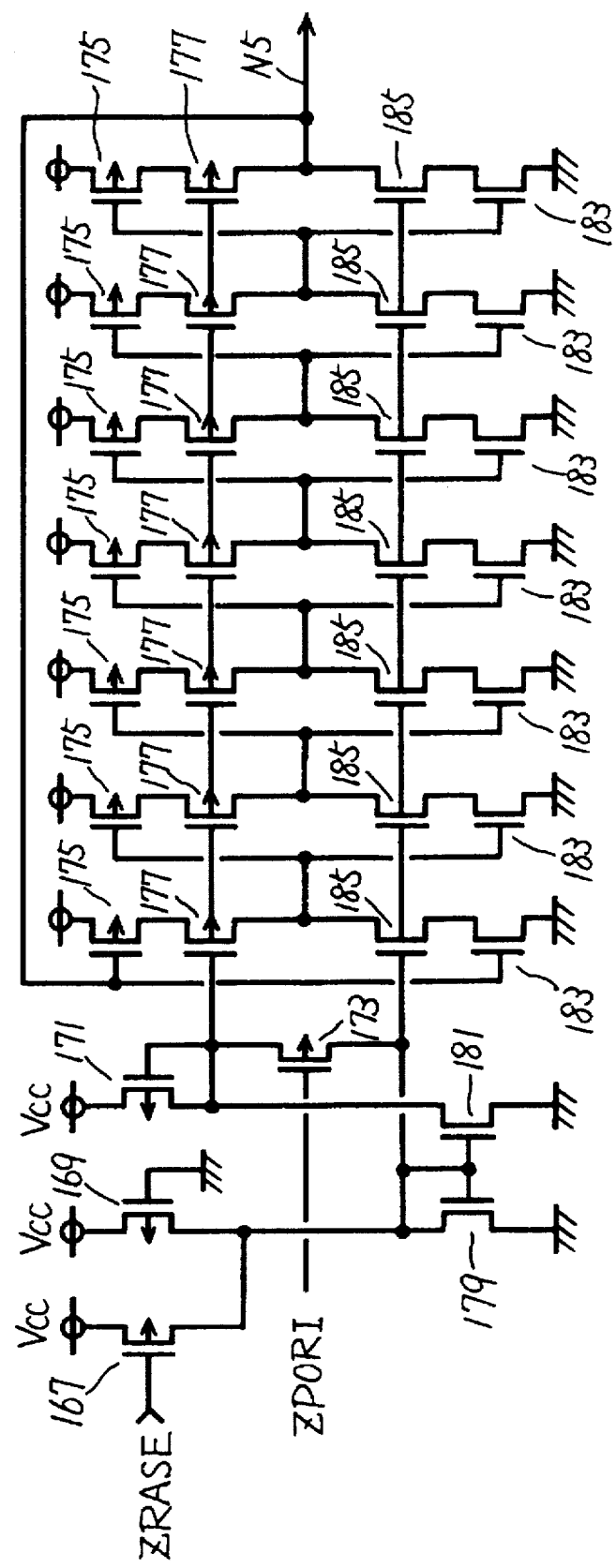
FIG. 7 is a circuit diagram showing in detail a general ring oscillator connected to node N5 shown in FIG. 2.

FIG. 7 is a circuit diagram showing in detail the general ring oscillator 43 of FIG. 2. The portions similar to those in FIG. 2 are indicated by the same reference numerals and description thereof will not be repeated.

Referring to FIG. 7, the general ring oscillator 43 of FIG. 2 includes PMOS transistors 167–177, and NMOS transistors 179–185. PMOS transistors 175 and 177 and NMOS transistors 185 and 183 form an inverter. PMOS transistor 177 and NMOS transistor 185 forming this inverter are provided to eliminate the through current. The circuit formed by PMOS transistors 167–173 and NMOS transistors 179 and 181 are provided to control PMOS transistor 177 and NMOS transistor 185.

The ring oscillator shown in FIG. 7 constantly applies a pulse signal with a long period to node N5. Signal ZPORI is similar to signal ZPORI shown in FIG. 4. Signal ZRASE is a signal changing from the "H" level to the "L" level and from the "L" level to the "H" level in response to signal /RAS or internal /RAS changing from the "H" level to the "L" level and from the "L" level to the "H" level, respectively.

Figure 8:
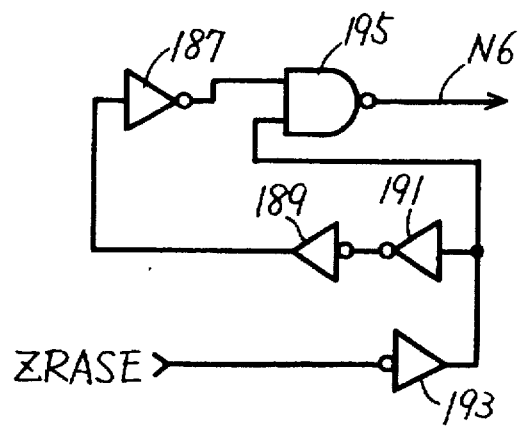
FIG. 8 is a circuit diagram showing in detail a general ring oscillator connected to node N6 shown in FIG. 2.

FIG. 8 is a circuit diagram showing in detail the general ring oscillator 45 of FIG. 2. The portions similar to those in FIG. 2 are indicated by the same reference numerals and description thereof will not be repeated.

Referring to FIG. 8, ring oscillator 45 of FIG. 2 includes inverters 187–193 and an NAND circuit 195. The general ring oscillator shown in FIG. 8 applies a pulse signal to node N6 in accordance with the transition of signal ZRASE. Signal ZRASE is similar to signal ZRASE in FIG. 7.

The substrate voltage generation unit of the DRAM according to the first embodiment of the present invention is characterized by detecting circuit 53 (FIG. 2). Therefore, ring oscillator control circuit 39, ring oscillators 41–45 and pump circuits 47–51 are similar to the ring oscillator control circuit, the ring oscillators and the pump circuits, respectively, in FIGS. 4–8.

Figure 9:
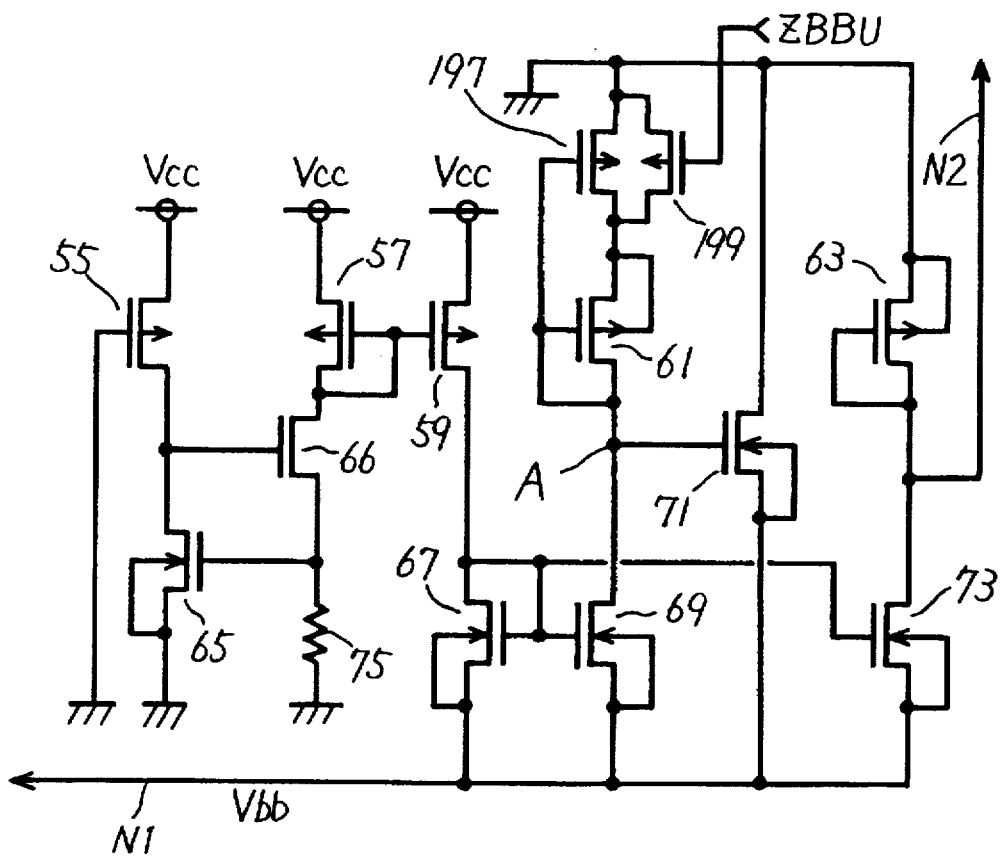
FIG. 9 is a circuit diagram showing in detail the detecting circuit shown in FIG. 2 for use in the DRAM according to the first embodiment of the present invention.

FIG. 9 is a circuit diagram showing in detail detecting circuit 53 for use in the substrate voltage generation unit of the DRAM according to the first embodiment of the present invention. The portions similar to those in FIG. 3 are labeled with the same reference numerals and description thereof will not be repeated.

Referring to FIG. 9, the detecting circuit used in the first embodiment includes PMOS transistors 55, 57, 59, 61, 63, 197, and 199, NMOS transistors 65, 66, 67, 69, 71, and 73, and a resistor 75.

PMOS transistor 59 and NMOS transistor 67 are connected in series between a node having a power supply potential Vcc and node N1. NMOS transistor 69 is connected between nodes N2 and N1. NMOS transistor 73 is connected between nodes A and N1. NMOS transistor 67 has a drain connected to the gates of NMOS transistors 67, 69 and 73.

PMOS transistors 197 and 61 are connected in series between a node with a ground potential and node A. PMOS transistors 197 and 61 have their gates connected to node A. PMOS transistor 199 is connected in parallel to PMOS transistor 197. PMOS transistor 199 receives signal ZBBU at its gate. NMOS transistor 71 is connected between the node with the ground potential and node N1, and has a gate connected to node A. PMOS transistor 63 is connected between the node with the ground potential and node N2, and has a gate connected to node N2. Node N2 is connected to node N2 in FIG. 2. Node N1 is connected to node N1 in FIG. 2.

In the normal mode of the DRAM, signal ZBBU of the "H" level is applied to PMOS transistor 199. As a result, the clamp level is determined by PMOS transistors 197 and 61. Meanwhile, in the special mode (description below relates to the self refresh mode) of the DRAM, signal ZBBU of the "L" level is applied to PMOS transistor 199. As a result, PMOS transistor 199 is turned on. Consequently, the clamp level is determined only by PMOS transistor 61. The clamp level is also similar to that described in connection with the detecting circuit shown in FIG. 3.

Based on the foregoing, the clamp level in the self refresh mode is greater than that in the normal mode. Therefore, the minimum value of substrate voltage Vbb in the self refresh mode is greater than that of substrate voltage Vbb in the normal mode. As a result, the capability of pause refresh in the self refresh mode is higher (longer) than that in the normal mode.

The higher capability of pause refresh allows increase in interval of internal /RAS attaining the "L" level. When internal /RAS attains the "L" level in the self refresh mode, one word line is selected and read out/writing operation is performed for a plurality of memory cells connected thereto. Therefore, power consumption for a prescribed time period is reduced by improving the capability of pause refresh and extending the interval of internal /RAS attaining the "L" level in the self refresh mode. It should be noted that, when the general detecting circuit shown in FIG. 3 is employed, power consumption in the self refresh mode cannot be reduced since the clamp level is the same in either the normal mode or the self refresh mode.

Figure 10:
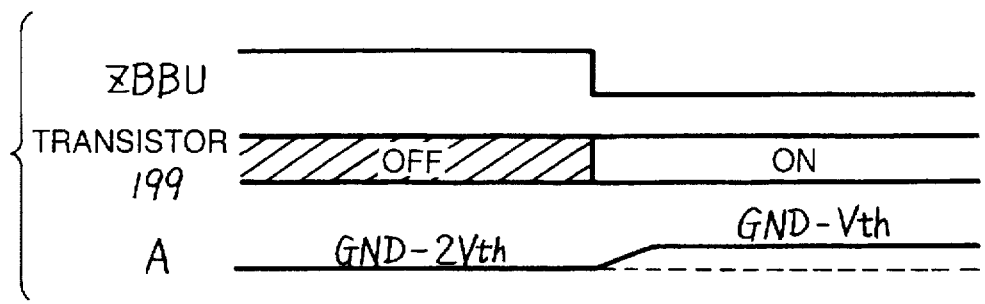
FIG. 10 shows the relationship between a clamp level and operation mode in the DRAM according to the first embodiment of the present invention.

FIG. 10 is a diagram used for description of the relationship between the clamp level and the operation mode of the DRAM.

In the normal mode of the DRAM, signal ZBBU is at the "H" level, so that PMOS transistor 199 shown in FIG. 9 is off. Therefore, assuming that the ground potential is GND and the threshold voltage of PMOS transistors 197 and 61 is Vth, the potential of node A is equal to GND–2Vth.

In the self refresh mode of the DRAM, signal ZBBU is at the "L" level, so that PMOS transistor 199 is on. Therefore, the potential of node A is equal to GND–Vth.

Thus, the potential (GND–Vth) of node A in the refresh mode exceeds the potential (GND–2Vth) of node A in the normal mode, whereby the clamp level in the self refresh mode exceeds that in the normal mode.

Figure 11:
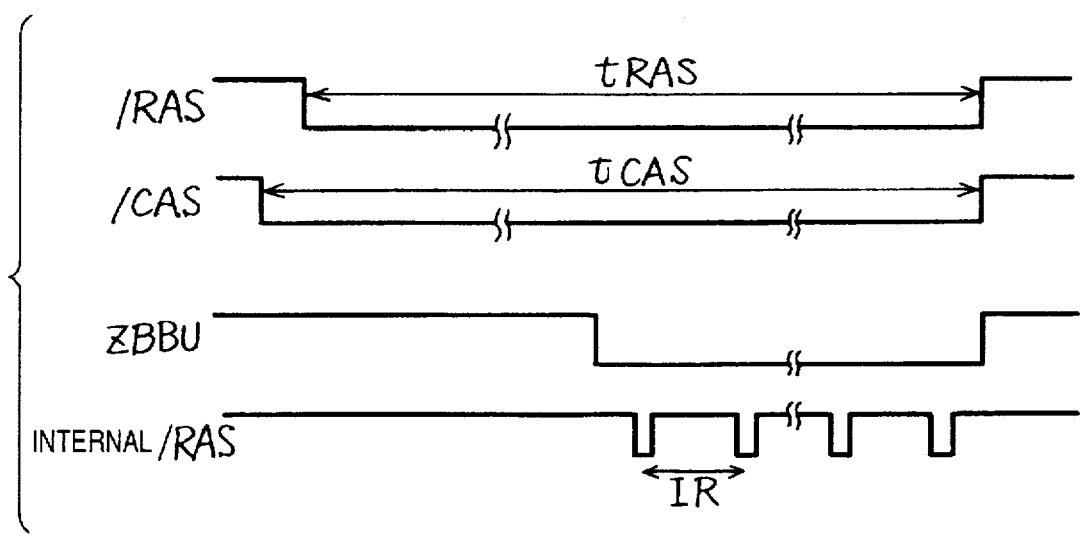
FIG. 11 is a timing chart showing generation timing of signal ZBBU shown in FIG. 9.

FIG. 11 is a diagram for use in description of the generation timing of signal ZBBU shown in FIG. 9. With the timing of signal /RAS attaining the "L" level after signal /CAS attains the "L" level (with the CBR timing), the self refresh mode is entered 70 μs after signal /RAS or signal /CAS attaining the "L" level. Therefore, pulse width $t_{RAS}$ and $t_{CAS}$ are set approximately 70 μs or greater.

Signal ZBBU is a signal which attains the "L" level in response to the entrance to the self refresh mode.

Now, description will be made of the relationship between pause refresh and self refresh. Referring to FIG. 11, internal /RAS attains the "L" level with an interval IR when signal ZBBU is at the "L" level. The following relationship is desirably established between capability P(ms) of pause refresh and time R(ms) required for all the memory cells to be refreshed in the self refresh mode.

$$P(ms) > R(ms) \qquad (2)$$

Here, with 2K (2048) refresh, for example, time R required for all the memory cells to be refreshed is expressed as follows.

$$R = IR \times 2K(2048) \qquad (3)$$

If the relationship P(ms)<R(ms) holds, that particular DRAM does not function satisfactorily as a DRAM with the self refresh mode. Therefore, interval IR must be set so that all the memory cells are refreshed within the range of capability P(ms) of pause refresh.

However, reduction in interval IR of internal /RAS attaining the "L" level leads to increase in consumed current in the self refresh mode, thereby preventing reduction in power consumption in the self refresh mode. In order to overcome such problem, the clamp level in the self refresh mode is set greater than that in the normal mode, i.e. substrate voltage Vbb in the self refresh mode is set greater than that in the normal mode, to improve (prolong) the capability of pause refresh. As a result, interval IR of internal /RAS attaining the "L" level is extended so that the current consumed in the self refresh mode per unit time can be reduced.

The reason for higher capability of pause refresh with greater substrate voltage Vbb is given as follows. Assuming that data of the "H" level, i.e. the positive charges are accumulated in the memory cell, the positive electric charges leak to the substrate receiving substrate voltage Vbb. Consequently, the smaller substrate voltage Vbb of a negative value results in the greater potential difference between the memory cell and the substrate, and therefore the positive charges are more likely to leak from the memory cell. In contrast, the greater the substrate voltage Vbb of a negative value is, the smaller becomes the potential difference between the memory cell and the substrate, and positive charges are less likely to leak from the memory cell.

For example, assuming that the potential of the memory cell is 5 V, substrate voltage Vbb in the self refresh mode is −2 V, and substrate voltage Vbb in the normal mode is −4 V, then the potential difference between the memory cell and the substrate is 7 V in the self refresh mode and 9 V in the normal mode. Naturally, positive electric charges are more likely to leak in the normal mode with the greater potential difference and are less likely to leak in the self refresh mode with the smaller potential difference.

It can be seen from the foregoing that the capability of pause refresh is improved with greater substrate voltage Vbb having a negative value.

As described above, the clamp level of the detecting circuit is set great in the self refresh mode and small in the normal mode in the substrate voltage generation unit of the DRAM according to the first embodiment of the present invention. As a result, substrate voltage Vbb in the refresh mode exceeds that in the normal mode. Consequently, the capability of pause refresh can be improved in the self refresh mode and interval IR of internal /RAS attaining the "L" level can be extended.

As a result, power consumption (current consumption) per unit time in the self refresh mode can be reduced in the DRAM according to the first embodiment of the present invention.

It should be noted that the clamp level is determined by the number of PMOS transistors connected in series between node A and the node with the ground potential in FIG. 9. The clamp level is reduced as the number of PMOS transistors between node A and the node with the ground potential is increased, and the clamp level is increased with decrease in the number of PMOS transistors between node A and the node with the ground potential.

[Second Embodiment]

The entire structure of a DRAM according to the second embodiment of the present invention is similar to that in FIG. 1. The substrate voltage generation unit of the DRAM according to the second embodiment is also similar to the substrate voltage generation unit in FIG. 2. However, with reference to FIG. 2, the DRAM according to the second embodiment differs from the DRAM according to the first embodiment in the structure of detecting circuit 53. The remaining portions have similar structures.

Figure 12:
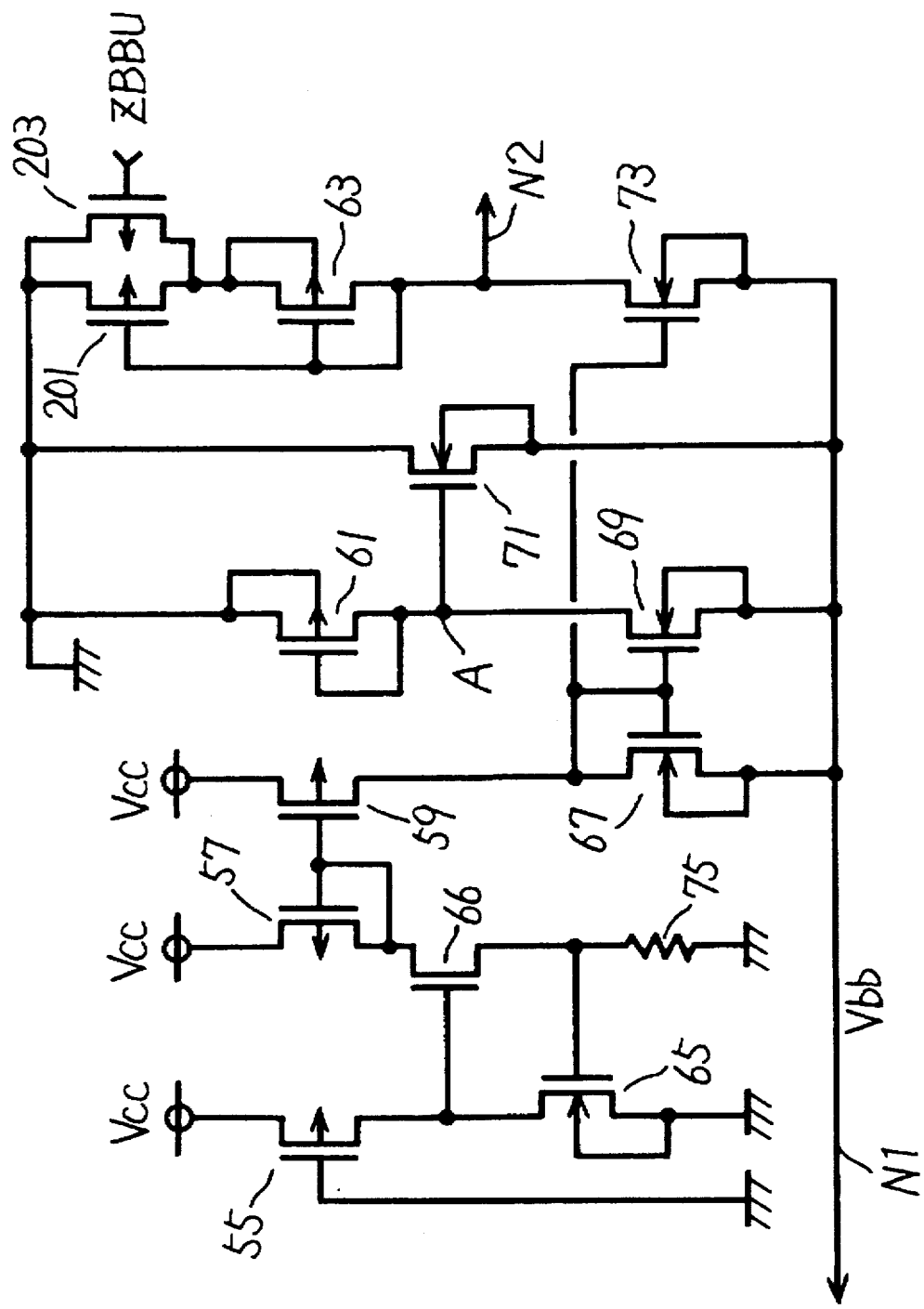
FIG. 12 is a circuit diagram showing in detail the detecting circuit of FIG. 2 for use in a DRAM according to the second embodiment of the present invention.

FIG. 12 is a circuit diagram showing in detail detecting circuit 53 (FIG. 2) for use in the internal voltage generation unit of the DRAM according to the second embodiment of the present invention. The portions similar to those in FIGS. 3 and 9 are indicated by the same reference numerals and description thereof will not be repeated.

Referring to FIG. 12, the detecting circuit used in the second embodiment includes PMOS transistors 55, 57, 59, 61, 63, 201, and 203, and NMOS transistors 65, 67, 69, 71, and 73, and resistor 75. PMOS transistor 61 is connected between a node with the ground potential and node A, and has a gate connected to node A. PMOS transistors 201 and 63 are connected in series between a node with the ground potential and node N2, and have the gates connected to node N2. PMOS transistor 203 is connected in parallel to PMOS transistor 201, and receives signal ZBBU at the gate. Signal ZBBU is similar to signal ZBBU in FIG. 9.

When the DRAM is in the normal mode, signal ZBBU of the "H" level is applied to PMOS transistor 203. As a result, the sustainment level is determined by PMOS transistors 201 and 63, so that pump circuit 47 of FIG. 2 stops operation when substrate voltage Vbb of a negative value is small. As a result, substrate voltage Vbb in the normal mode is small in magnitude.

In contrast, in the self refresh mode PMOS transistor 203 receives signal ZBBU of the "L" level. Therefore, the sustainment level is determined only by PMOS transistor 63, so that pump circuit 47 of FIG. 2 stops operation when substrate voltage Vbb of a negative value is great. In other words, substrate voltage Vbb is great in magnitude in the self refresh mode. The sustainment level is similar to that described in connection with the detecting circuit of FIG. 3.

As described, the sustainment level in the self refresh mode exceeds that in the normal mode in the detecting circuit employed in the internal voltage generation unit of the DRAM according to the second embodiment of the present invention. Therefore, substrate voltage Vbb generated in the self refresh mode exceeds substrate voltage Vbb generated in the normal mode. This means that the capability of pause refresh is improved in the self refresh mode. With the higher capability of pause refresh, the interval of internal /RAS attaining the "L" level can be set longer.

Consequently, power consumption for a given time period in the self refresh mode can be reduced in the DRAM according to the second embodiment of the present invention.

The sustainment level is set by the number of PMOS transistors connected between the node with the ground potential and node N2. The sustainment level is reduced as the number of PMOS transistors between the node with the ground potential and node N2 is increased, and the sustainment level is increased with decrease in number of PMOS transistors between the node with the ground potential at node N1.

[Third Embodiment]

The structure of a DRAM according to the third embodiment of the present invention is similar as a whole to that of the DRAM in FIG. 1. The internal voltage generation unit of the DRAM according to the third embodiment is similar to the internal voltage generation unit in FIG. 2. However, with reference to FIG. 2, the DRAM according to the third embodiment differs from that of the first embodiment in ring oscillator 43. The remaining portions are similar to each other.

Figure 13:
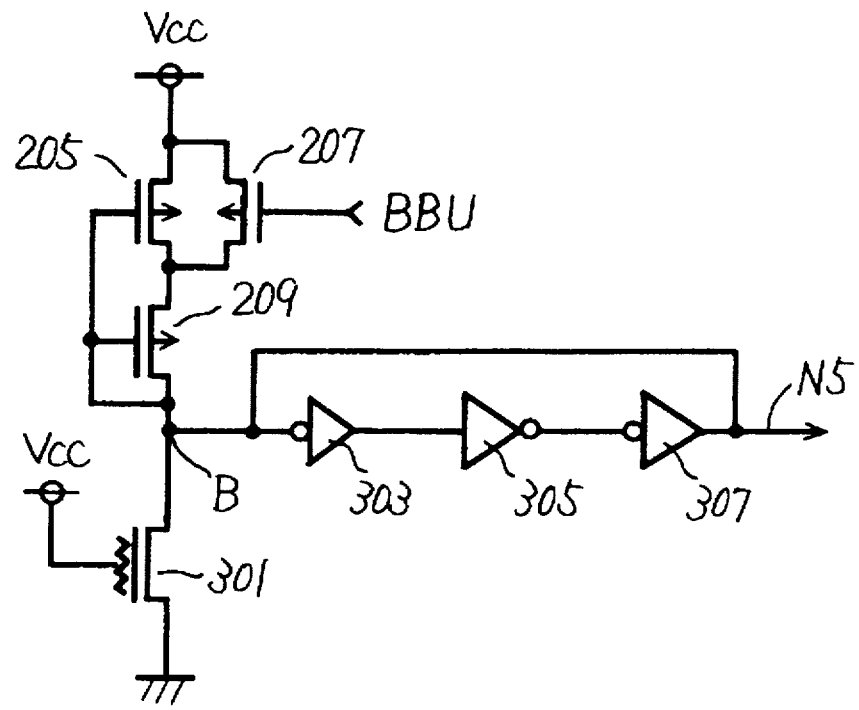
FIG. 13 is a circuit diagram showing in detail a ring oscillator connected to node N5 of FIG. 2 for use in a DRAM according to the third embodiment of the present invention.

FIG. 13 is a circuit diagram showing in detail ring oscillator 43 (FIG. 2) employed in the internal voltage generation unit of the DRAM according to the third embodiment of the present invention. The portions similar to those in FIG. 2 are labeled with the same reference numerals and description thereof will not be repeated.

Referring to FIG. 13, ring oscillator 43 (FIG. 2) employed in the third embodiment includes PMOS transistors 205, 207, and 209, an NMOS transistor 301, and inverters 303, 305 and 307. NMOS transistor 301 has high resistance.

PMOS transistors 205 and 209 are connected in series between a node with power supply voltage Vcc and node B. PMOS transistors 205 and 209 have the gates connected to node B. PMOS transistor 207 is connected in parallel to PMOS transistor 205.

PMOS transistor 207 receives signal BBU at the gate. NMOS transistor 301 is connected between a node with ground potential and node B, and has a gate connected to the node with power supply voltage Vcc. Three inverters 303–307 are connected between B and node N5. Node N5 and node B are connected with each other.

Referring to FIG. 13, in the self refresh mode PMOS transistor 207 receives signal BBU of the "H" level. As a result, assuming that PMOS transistors 205 and 209 have threshold voltage Vth, the voltage of node B is equal to Vcc−2Vth.

In the normal mode, PMOS transistor 207 receives signal BBU of the "L" level, and is therefore turned on. Consequently, the potential of node B is equal to Vcc−Vth.

As described above, the potential of node B in the self refresh mode is smaller than that in the normal mode. Therefore, the period of the pulse signal applied to node N5 in the self refresh mode is longer than that of the pulse signal applied to node N5 in the normal mode. Thus, the capability of pump circuit shown in FIG. 2 to generate substrate voltage Vbb in the self refresh mode is lower than that in the normal mode. In other words, substrate voltage Vbb having a negative value in the self refresh mode exceeds that in the normal mode. Signal BBU is an inverted version of signal ZBBU in FIG. 9.

As described above, the constantly operating ring oscillator (ring oscillator 43 in FIG. 2) for use in internal voltage generation unit of the DRAM according to the third embodiment has the capability of generating substrate voltage Vbb weak in the self refresh mode and strong in the normal mode. As a result, the capability of pause refresh can be improved in the self refresh mode. With the higher capability of pose refresh, the interval of internal /RAS attaining the "L" level can be extended.

Consequently, power consumption per unit time can be reduced in the self refresh mode in the DRAM according to the third embodiment of the present invention.

[Fourth Embodiment]

The structure of a DRAM according to the fourth embodiment of the present invention is similar as a whole to that of the DRAM in FIG. 1. The internal voltage generation unit of the DRAM according to the fourth embodiment is similar to the internal voltage generation unit in FIG. 2. However, with reference to FIG. 2, the DRAM according to the fourth embodiment differs from the DRAM according to the first embodiment in ring oscillator 45. The remaining portions are similar to each other.

Figure 14:
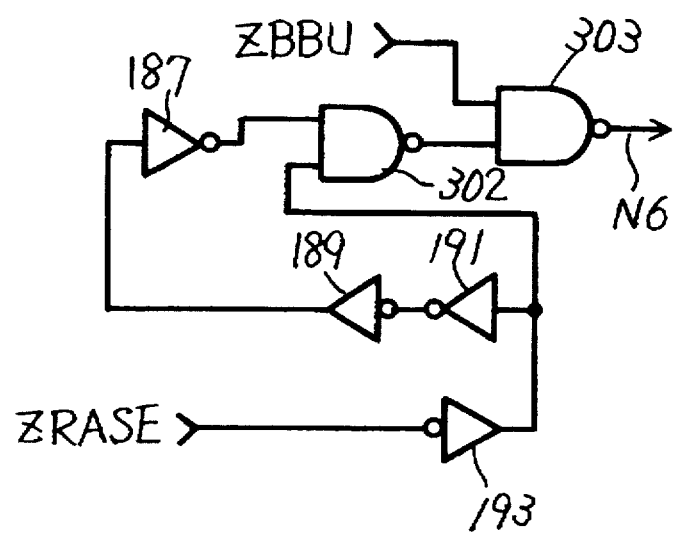
FIG. 14 is a circuit diagram showing in detail a ring oscillator connected to node N6 for use in a DRAM according to the fourth embodiment of the present invention.

FIG. 14 is a circuit diagram showing in detail ring oscillator 45 (FIG. 2) for use in the internal voltage generation unit of the DRAM according to the fourth embodiment of the present invention. The portions similar to those in FIGS. 2 and 8 are labeled with the same reference numerals and description thereof will not be repeated.

Referring to FIG. 14, ring oscillator 45 (FIG. 2) employed in the fourth embodiment includes inverters 187, 189, 191, and 193, and NAND circuits 302 and 303.

Inverter 193 receives signal ZRASE, and has an output node connected to an input node of inverter 191 and one input node of NAND circuit 302. Inverter 191 has an output node connected to an input node of inverter 189. Inverter 189 has an output node connected to an input node of inverter 187. Inverter 187 has an output node connected to the other input node of NAND circuit 302. NAND circuit 302 has an output node connected to one input node of NAND circuit 303. NAND circuit 303 receives signal ZBBU at the other input node.

When the DRAM is in the normal mode, NAND circuit 303 receives signal ZBBU of the "H" level. Therefore, in the normal mode, when signal ZRASE changes from the "H" level to the "L" level or from the "L" level to the "H" level, a pulse is applied from node N6 in accordance with such change. Signal ZRASE changes from the "H" level to the "L" level in response to signal /RAS or internal /RAS changing from the "H" level to the "L" level, and changes from the "L" to the "H" level in response to signal RAS or internal /RAS changing from the "L" level to the "H" level.

In the self refresh mode, NAND circuit 303 receives signal ZBBU of the "L" level. As a result, the output from NAND circuit 303 is fixed at the "L" level. This means that pump circuit 51 of FIG. 2 does not operate in the self refresh mode. Since pump circuit 51 of FIG. 2 does not operate in the self refresh mode, the capability of the entire internal voltage generation unit to generate substrate voltage Vbb is weakened. In other words, substrate voltage Vbb is greater in the self refresh mode than in the normal mode.

As described above, ring oscillator 45 (FIG. 2) of the internal voltage generation unit of the DRAM according to the fourth embodiment of the present invention stops operation in the self refresh mode. As a result, substrate voltage Vbb in the self refresh mode exceeds substrate voltage Vbb in the normal mode. This means that the capability of pause refresh in the self refresh mode is higher than in the normal mode. With the higher capability of pause refresh, the interval of internal /RAS attaining the "L" level can be prolonged.

As a result, power consumption per unit time can be reduced in the self refresh mode in the DRAM according to the fourth embodiment of the present invention.

In addition, since ring oscillator 45 and pump circuit 51 (FIG. 2) stop operation in the self refresh mode in the DRAM according to the fourth embodiment of the present invention, power consumption can be further reduced in the self fresh mode.

It is to be noted that signal ZBBU is similar to signal ZBBU in FIG. 9.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a normal mode and a special mode, comprising:
   substrate voltage generation means for generating a substrate voltage having a negative value to be applied to output node; wherein
   said substrate voltage generation means includes
   detecting means for detecting a potential level of said output node, and
   voltage generation means for generating said substrate voltage in accordance with the potential level detected by said detecting means,
   said detecting means causes said voltage generation means to operate when the potential of said output node exceeds a predetermined potential, and
   said detecting means is responsive to a signal indicating that said special mode is entered for setting said predetermined potential to a level higher than the level in the normal mode.

2. The semiconductor memory device according to claim 1, wherein said detecting means includes a plurality of first transistors connected in series between a first node and a second node, control electrodes of said plurality of first transistors are connected to said second node, said second node has a potential in accordance with the potential of said output node, the potential of said second node is lower than the potential of said first node, said detecting means further includes a second transistor connected in parallel to at least one of said plurality of first transistors, said second transistor is turned on by receiving at its control electrode the signal indicating that said special mode is entered, whereby said predetermined potential is set to a level higher in said special mode than in said normal mode, and said predetermined potential in said special mode and said predetermined potential in said normal mode have the magnitude determined by the number of said first transistors.

3. A semiconductor memory device having a normal mode and a special mode, comprising:

substrate voltage generation means for generating a substrate voltage having a negative value to be applied to an output node; wherein said substrate voltage generation means includes
detecting means for detecting a potential level of said output node, and
voltage generation means for generating said substrate voltage, said detecting means discharges electrons from said output node when the potential of said output node is lower than a predetermined potential, and said detecting means is responsive to a signal indicating that said special mode is entered for setting said predetermined potential to a level higher than the level in the normal mode.

4. The semiconductor memory device according to claim 3, wherein said detecting means includes a plurality of first transistors connected in series between a first node and a second node, control electrodes of said plurality of first transistors are connected to said second node, said second node has a potential in accordance with the potential of said output node, the potential of said second node is lower than the potential of said first node, said detecting means further includes a second transistor connected in parallel to at least one of said plurality of first transistors, said second transistor is turned on by receiving at its control electrode the signal indicating that said special mode is entered, whereby said predetermined potential is set to a level higher in said special mode than in said normal mode, and said predetermined potential in said special mode and said predetermined potential in said normal mode have the magnitude determined by the number of said first transistors.

5. A semiconductor memory device having a normal mode and a special mode, comprising:

substrate voltage generation means for generating a substrate voltage having a negative value to be applied to an output node; wherein said substrate voltage generation means includes
pump means for generating said substrate voltage,
ring means for generating a pulse signal for causing said pump means to operate, and
ring control means for controlling a frequency of said pulse signal from said ring means, and said ring control means is responsive to a signal indicating that said special mode is entered for applying a potential lower than the potential in the normal mode to an input node of said ring means.

6. The semiconductor memory device according to claim 5, wherein said ring control means includes a plurality of first transistors connected in series between said input node of said ring means and a high potential node having a potential greater than that of said input node, control electrodes of said plurality of first transistors are connected to said input node, said ring control means further includes a second transistor connected in parallel to at least one of said plurality of first transistors, said second transistor is turned off by receiving at its control electrode the signal indicating that said special mode is entered, thereby applying in said special mode a potential lower than the potential in said normal mode to said input node, and the potential applied to said input node in said special mode and the potential applied to said input mode in said normal mode have the magnitude determined by the number of said first transistors.

7. A semiconductor memory device having a normal mode and a special mode, comprising:

first substrate voltage generation for generating a first substrate voltage having a negative value to be applied to an output node;

second substrate voltage generation means constantly in operation for generating a second substrate voltage having a negative value to be applied to said output node; and third substrate voltage generation means responsive to a control signal controlling internal operation of said semiconductor memory device for generating a third substrate voltage having a negative value to be applied to said output node; wherein said first substrate voltage generation means operates in accordance with a potential level of said output node, and said third substrate voltage generation means stops operation in said special mode.

8. The semiconductor memory device according to claim 1, wherein said special mode is a self refresh mode.

9. The semiconductor memory device according to claim 2, wherein said special mode is a self refresh mode.

10. The semiconductor memory device according to claim 3, wherein said special mode is a self refresh mode.

11. The semiconductor memory device according to claim 4, wherein said special mode is a self refresh mode.

12. The semiconductor memory device according to claim 5, wherein said special mode is a self refresh mode.

13. The semiconductor memory device according to claim 6, wherein said special mode is a self refresh mode.

14. The semiconductor memory device according to claim 7, wherein said special mode is a self refresh mode.

* * * * *